(12) United States Patent
Miyano

(10) Patent No.: US 6,690,214 B2
(45) Date of Patent: Feb. 10, 2004

(54) DLL CIRCUIT AND DLL CONTROL METHOD

(75) Inventor: Kazutaka Miyano, Tokyo (JP)

(73) Assignees: NEC Corporation, Tokyo (JP); NEC Electronics Corporation, Kanagawa (JP)

(*) Notice: Subject to any disclaimer, the term of this patent is extended or adjusted under 35 U.S.C. 154(b) by 110 days.

(21) Appl. No.: 09/904,035

(22) Filed: Jul. 12, 2001

(65) Prior Publication Data

US 2002/0014901 A1 Feb. 7, 2002

(30) Foreign Application Priority Data

Jul. 13, 2000 (JP) ........................................ 2000-212751

(51) Int. Cl.[7] ................................................ H03L 7/06
(52) U.S. Cl. ........................ 327/149; 327/158; 327/161; 331/DIG. 2
(58) Field of Search ................................ 327/144, 146, 327/147, 149, 151, 152, 153, 155, 158, 160, 161, 162, 163, 172, 175, 231; 375/371, 373, 375, 376; 331/25, 1 A, DIG. 2

(56) References Cited

U.S. PATENT DOCUMENTS 5,299,237 A * 3/1994 Head ............................ 327/141
5,675,620 A * 10/1997 Chen ............................ 331/2
5,828,257 A * 10/1998 Masleid ........................ 327/158
6,342,796 B2 * 1/2002 Jung ............................ 327/141

FOREIGN PATENT DOCUMENTS

| JP | 9-17179 | 1/1997 |
| JP | 10-285020 | 10/1998 |
| JP | 11-17529 | 1/1999 |
| JP | 11-168376 | 6/1999 |
| JP | 2000-68797 | 3/2000 |

* cited by examiner

Primary Examiner—Minh Nguyen
(74) Attorney, Agent, or Firm—Darryl G. Walker; Bradley T. Sako

(57) ABSTRACT

A delay locked loop (DLL) circuit (10) can include first phase decision circuit (1), a second phase decision circuit (2), an arbitrary phase generator circuit (3), and a variable pulse width circuit (4). First phase decision circuit (1) may receive an external clock signal (D1) and an internal clock signal (D3) and may generate a phase decision signal (D4) that may indicate whether a first edge of internal clock signal (D3) is to be sped-up or delayed. Arbitrary phase generator circuit (3) may provide a phase shifted signal based on phase decision signal (D4). Second phase decision circuit (2) may receive external clock signal (D1) and internal clock signal (D3) and may generate a phase decision signal (D5) that may indicate whether a second edge of internal clock signal (D3) is to be sped-up or delayed. Variable pulse width circuit (4) may receive the phase shifted signal and delay a falling edge based on phase decision signal (D5).

11 Claims, 7 Drawing Sheets

DLL CIRCUIT AND DLL CONTROL METHOD

TECHNICAL FIELD

The present invention relates generally to a delay locked loop (DLL) circuit and a DLL control method and more particularly to DLL circuit and DLL control method for locking and outputting rising and falling phases of a clock signal.

BACKGROUND OF THE INVENTION

In a semiconductor device, such as a semiconductor memory, an external clock signal is typically used to synchronize data transfer. In such a semiconductor memory, data can be input and output on rising and falling edges of the external clock signal. A delay locked loop (DLL) circuit can be incorporated in such a device in order to generate an internal clock signal that is synchronized with the external clock signal. A DLL circuit uses a variable delay to delay an internal clock signal so that the edges become synchronized (phase matching) with the external clock signal. Thus, an accurate DLL circuit requires a circuit for accurately generating a phase delay.

Referring now to FIG. 1, a block schematic diagram of a conventional DLL circuit is set forth and given the general reference character 100.

Conventional DLL circuit 100 synchronizes an output clock signal with both the rising and falling edges of an external clock signal.

Conventional DLL circuit 100 includes a first DLL system 101 and a second DLL system 102. First DLL system 101 receives an external clock signal D101 and a reference clock D102 and generates a first internal clock signal D104. Second DLL system 102 receives external clock signal D101 and reference clock D102 and generates a second internal clock signal D106.

First DLL system 101 includes a first phase detection circuit 111, a first arbitrary phase generation circuit 112, and a buffer 113. First phase detection circuit 111 receives the external clock signal D101 and first internal clock signal D104 as inputs and generates a phase detection result signal D103. First arbitrary phase generator circuit 112 receives reference clock D102 and phase decision result signal D103. First arbitrary phase generator circuit 112 delays the phase of reference clock signal D102 based upon the value of phase decision result signal D103 to generate delayed clock signal D102'. Buffer 113 receives delayed clock signal D102' and generates first internal clock signal D104.

First internal clock signal D104 is input into first phase decision circuit 111. First phase decision circuit compares the rising edge of external clock signal D101 with first internal clock signal D104 and outputs first phase decision result signal D103. First phase decision result signal D103 indicates the phase difference between the rising edges of external clock signal D101 and first internal clock signal D104. When external clock signal D101 and first internal clock signal D104 having rising edges that are coincident with each other in their phases, delayed clock signal 102' becomes locked in its phase.

Second DLL system 102 includes a second phase detection circuit 114, a second arbitrary phase generation circuit 115, and a buffer 116. Second phase detection circuit 114 receives the external clock signal D101 and second internal clock signal D106 as inputs and generates a phase detection result signal D105. Second arbitrary phase generator circuit 115 receives reference clock D102 and phase decision result signal D105. Second arbitrary phase generator circuit 115 delays the phase of reference clock signal D102 based upon the value of phase decision result signal D105 to generate delayed clock signal D102". Buffer 116 receives delayed clock signal D102" and generates second internal clock signal D106.

Second internal clock signal D106 is input into second phase decision circuit 114. Second phase decision circuit compares the falling edge of external clock signal D101 with second internal clock signal D106 and outputs second phase decision result signal D105. Second phase decision result signal D105 indicates the phase difference between the falling edges of external clock signal D101 and second internal clock signal D106. When external clock signal D101 and second internal clock signal D106 having falling edges that are coincident with each other in their phases, delayed clock signal 102" becomes locked in its phase.

Referring now to FIGS. 2(a)–(c), a timing diagram illustrating external clock signal D101, first internal clock signal D104, and second internal clock signal D106 is set forth.

The timing diagram of FIGS. 2(a)–(c) illustrates signals generated by conventional DLL circuit 100 when the high edged pulse width of first and second internal clock signals (D104 and D106) is greater than the high pulse width of external clock signal D101. It is noted that only one edge of first internal clock signal D104 (rising edge) and second internal clock signal D106 (falling edge) has a phase that is locked with external clock signal D101. Thus, the pulse widths of the first and second internal clock signals (D104 and D106) is not set by the phase of external clock signal D101. So, even though the first and second internal clock signals (D104 and D106) have the same period (T1) as the external clock signal D101, the waveforms do not match.

Referring now to FIGS. 3(a)–(c), a timing diagram illustrating external clock signal D101, first internal clock signal D104, and second internal clock signal D106 is set forth.

The timing diagram of FIGS. 3(a)–(c) illustrates signals generated by conventional DLL circuit 100 when the high edged pulse width of first and second internal clock signals (D104 and D106) is less than the high pulse width of external clock signal D101. It is noted that only one edge of first internal clock signal D104 (rising edge) and second internal clock signal D106 (falling edge) has a phase that is locked with external clock signal D101. Thus, the pulse widths of the first and second internal clock signals (D104 and D106) is not set by the phase of external clock signal D101. So, even though the first and second internal clock signals (D104 and D106) have the same period (T1) as the external clock signal D101, the waveforms do not match.

In conventional DLL circuit 100 first DLL system 101 and second DLL system 102 each have an arbitrary phase generator circuit (112 and 115) in order to create internal clock signals (D104 and D106) that are locked, respectively, with a rising edge and falling edge of external clock signal D101. Arbitrary phase generator circuits (112 and 115) require a large amount of chip area compared to the other circuits in the conventional DLL circuit 100. In order to generate a clock with reduced jitter having an arbitrary phase using arbitrary phase generator circuit (112 and 115), a large amount of chip area may be required, which increases manufacturing costs. Also, power consumption of arbitrary phase generator circuits (112 and 115) is a large portion of the power consumed in the conventional DLL circuit 100.

Also, because a separate internal clock signal (D104 and D106) are generated in order to have internal clocks that are locked in phase with the rising and falling edges, respectively, of external clock signal D101, a circuit that is clocked off one edge may receive a different signal than one clocked off the opposite edge. This can increase signal routing and consume chip area.

In view of the above discussion, it would be desirable to provide a DLL circuit that may be capable of outputting a single system clock signal in synchronism with both rising and falling edges of an external clock signal. It would also be desirable to provide a DLL control method for controlling the DLL circuit. It would be desirable to provide a DLL circuit having reduced power consumption compared to conventional approaches. It would also be desirable to provide a DLL circuit, which occupies a reduced chip area as compared to conventional approaches.

SUMMARY OF THE INVENTION

According to the present embodiments, a delay locked loop (DLL) circuit having an internal clock signal with positive and negative clock edges locked with an externally applied clock signal is provided. The DLL circuit may include a first phase decision circuit, a second phase decision circuit, an arbitrary phase generator circuit, and a variable pulse width circuit. The first phase decision circuit may receive an the external clock signal and internal clock signal and may generate a phase decision signal that may indicate whether a first edge of the internal clock signal is to be sped-up or delayed. The arbitrary phase generator may provide a phase shifted signal based on the phase decision signal. The second phase decision circuit may receive the external clock signal and the internal clock signal and may generate a phase decision signal that may indicate whether a second edge of the internal clock signal is to be sped-up or delayed. The variable pulse width circuit may receive the phase shifted signal and delay a second edge based on the phase decision signal.

According to one aspect of the embodiments, an external clock may have a first external clock edge and a second external clock edge. An internal clock may have a first internal clock edge and a second internal clock edge. A first phase decision circuit may receive the external clock and the internal clock and may provide a first phase decision signal based on a phase relationship between the first external clock edge and the first internal clock edge. An arbitrary phase generator circuit may receive the first phase decision signal and may provide an adjusted phase clock having a phase based on the value of the first phase decision signal. A variable pulse width circuit may receive a second phase decision signal and may delay the second internal clock edge based on the value of the second phase decision signal.

According to another aspect of the embodiments, the first internal clock edge may be substantially locked with the first external clock edge. The second internal clock edge may be substantially locked with the second external clock edge.

According to another aspect of the embodiments, the first internal clock edge and the first external clock edge may be positive transitioning edges. The second internal clock edge and the second external clock edge may be negative transitioning edges.

According to another aspect of the embodiments, the first internal clock edge and the first external clock edge may be negative transitioning edges. The second internal clock edge and the second external clock edge may be positive transitioning edges.

According to another aspect of the embodiments, the arbitrary phase generator may receive a reference clock and may provide the adjusted phase clock being phase shifted from the reference clock.

According to another aspect of the embodiments, the arbitrary phase generator may include a phase clock signal generator, a phase control circuit, and a clock signal select circuit. The phase clock signal generator may receive the reference clock and may provide a plurality of phase shifted clock signals. The phase control circuit may receive the first phase decision signal and may provide at least one clock select signal. The clock signal select circuit may receive the at least one clock select signal and select one of the plurality of phase shifted clock signals to generate the adjusted phase clock.

According to another aspect of the embodiments, the DLL circuit can include a reference clock having a first reference clock edge and a second reference clock edge, a locked clock having a first locked clock edge and a second locked clock edge, a first delay circuit providing a delay in a subsequent first locked clock edge based on the timing of a previous first locked clock edge, and a second delay circuit providing a delay in a subsequent second clock edge based on the timing of a previous second locked clock edge.

According to another aspect of the embodiments, the second delay circuit may receive a phase decision result signal having a logic value based on the timing of the second reference clock edge with respect to the second latched clock edge. The second delay circuit may include a delay control circuit and a delay generator. The delay control circuit may receive the phase decision result signal and may provide a first delay potential. The delay generator may receive the first delay potential provide the locked clock signal in which the second locked clock edge is delayed according to the first delay potential.

According to another aspect of the embodiments, the second delay circuit may include a first controllable impedance device that may receive the first delay potential and provide an impedance based on the first delay potential. The second locked clock edge may be delayed according to the impedance of the first controllable impedance device.

According to another aspect of the embodiments, the second delay circuit may include a second delay potential provided by the second delay control circuit. A second controllable impedance path may receive the second delay potential and may provide an impedance based on the second delay potential. The second locked clock edge may be delayed according to the impedance of the first controllable impedance device and the impedance of the second controllable impedance device.

According to another aspect of the embodiments, a first impedance control node may receive the first delay potential. The delay control circuit may include a first capacitor connected to the first impedance control node. A second impedance control node may receive the second delay potential. The delay control circuit may include a second capacitor connected to the second impedance control node.

According to another aspect of the embodiments, the first locked clock edge and first reference clock edge may be positive clock edges. The second locked clock edge and second reference clock edge may be negative clock edges.

According to another aspect of the embodiments, the first locked clock edge and first reference clock edge may be negative clock edges. The second locked clock edge and second reference clock edge may be positive clock edges.

According to another aspect of the embodiments, a first phase decision circuit may receive the reference clock and the locked clock and may generate a first phase decision result signal based on the timing of the first reference clock edge and the first locked clock edge. The first delay circuit may receive the first phase decision result signal. The first phase decision circuit may include a latch circuit that may receive the reference clock and a reference potential and may latch a first decision logic level if the reference clock has a potential greater than the reference potential at the first locked clock edge. The first latch circuit may latch a second decision logic level if the reference clock has a potential lower than the reference potential at the first locked clock edge.

According to another aspect of the embodiments, a second phase decision circuit may receive the reference clock and the locked clock and may generate a second phase decision result signal based on the timing of the second reference clock edge and the second locked clock edge. The second delay circuit may receive the second phase decision result signal. The second phase decision circuit may include a second latch circuit that may receive the reference clock and a reference potential and may latch a third decision logic level if the reference clock has a potential greater than the reference potential at the second locked clock edge. The first latch circuit may latch a fourth decision logic level if the reference clock has a potential lower than the reference potential at the second locked clock edge.

According to another aspect of the embodiments, a delay locked loop (DLL) control method may include comparing a first phase of an external clock with a first phase of an internal clock and generating a first comparison result, generating an adjusted clock from a reference clock based on the first comparison result, and adjusting the pulse width of the adjusted clock to generate the internal clock.

According to another aspect of the embodiments, adjusting the pulse width of the adjusted clock may include comparing a second phase of the external clock with a second phase of the internal clock and generating a second comparison result, and adjusting the pulse width of the adjusted clock based on the second comparison result.

According to another aspect of the embodiments, comparing the second phase of the external clock with the second phase of the internal clock may include enabling a second phase decision circuit based on a second internal clock edge to generate the second comparison result based on the logic level of the external clock.

According to another aspect of the embodiments, adjusting the pulse width of the adjusted clock may include modifying the propagation delay of a delay circuit by adjusting the impedance of a controllable impedance path.

According to another aspect of the embodiments, generating an adjusted clock from a reference clock may include generating complementary clock signals that may be phase shifted from the reference clock according to the first comparison result.

DETAILED DESCRIPTION OF THE EMBODIMENTS

Various embodiments of the present invention will now be described in detail with reference to a number of drawings.

Figure 4:
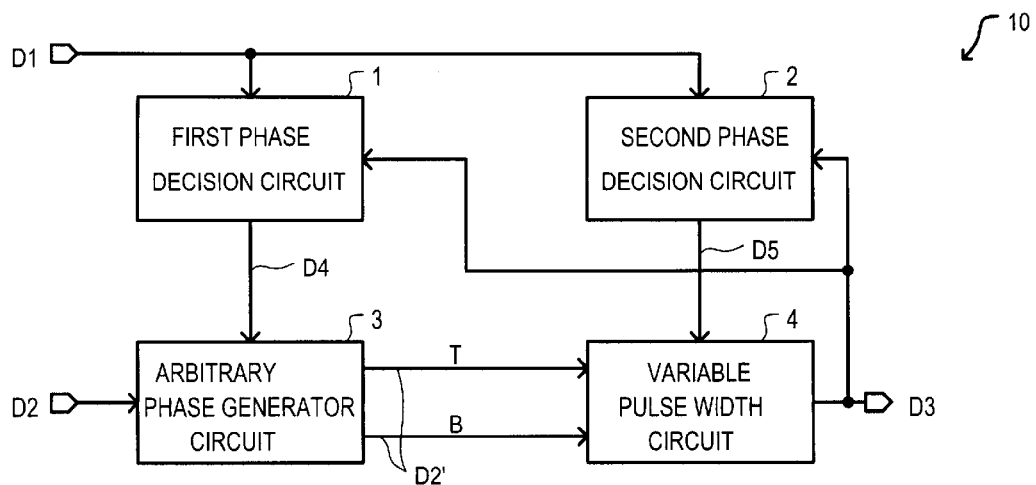
FIG. 4 is a block schematic diagram of a delay locked loop (DLL) circuit according to one embodiment.

Referring now to FIG. 4, a block schematic diagram of a delay locked loop (DLL) circuit according to one embodiment is set forth and given the general reference character 10.

DLL circuit 10 may receive an external clock D1 and a reference clock signal D2 as inputs and may generate an internal clock signal D3. DLL circuit 10 can include a first phase decision circuit 1, a second phase decision circuit 2, an arbitrary phase generator circuit 3, and a variable pulse width circuit 4.

First phase decision circuit 1 may receive external clock signal D1 and internal clock signal D3 as inputs and may generate a phase decision result signal D4. Second phase decision circuit 2 may receive external clock signal D1 and internal clock signal D3 as inputs and may generate a phase decision result signal D5. Arbitrary phase generator circuit 3 may receive reference clock signal D2 and phase decision result signal D4 as inputs and may generate an adjusted reference clock signal D2'. Adjusted reference clock signal D2' may include complementary reference clock signals (T and B), which may have opposite phases. Variable pulse width circuit 4 may receive phase decision result signal D5 and adjusted reference clock signal D2' and may generate internal clock signal D3.

First phase decision circuit 1 may generate phase decision result signal D4 based on the logic level of external clock signal D1 at the rising edge of internal clock signal D3. Arbitrary phase generator circuit 3 may phase shift reference clock signal D2 based on phase decision result signal D4 to provide adjusted reference clock signal D2'. Second phase decision circuit 2 may generate phase decision result signal D5 based on the logic level of external clock signal D1 at the falling edge of internal clock signal D3. Variable pulse width circuit 4 may modify the pulse width of adjusted reference clock signal D2' based on phase decision result signal D5 to provide internal clock signal D3. In this way, internal clock signal D3 may have a phase that may be locked to the phase of external clock signal D1.

Figure 11:
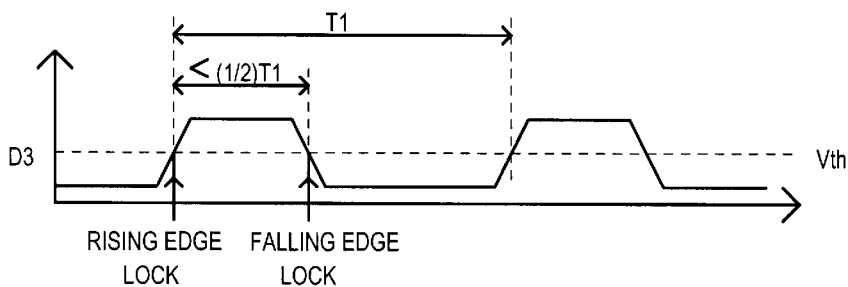
FIG. 11 is a timing diagram illustrating internal clock signal D3 according to one embodiment.

Referring now to FIG. 11, a timing diagram illustrating internal clock signal D3 according to one embodiment is set forth. The timing diagram of FIG. 11 may illustrate a case in which the high-going pulse width of external clock signal D1 is less than one-half T1, where T1 is the period of external clock signal D1. The rising and falling edges of internal clock signal D3 may be locked on the rising and falling edges of external clock D1. In this way, a single internal clock signal may be generated that locks onto both edges of an external clock signal.

Figure 12:
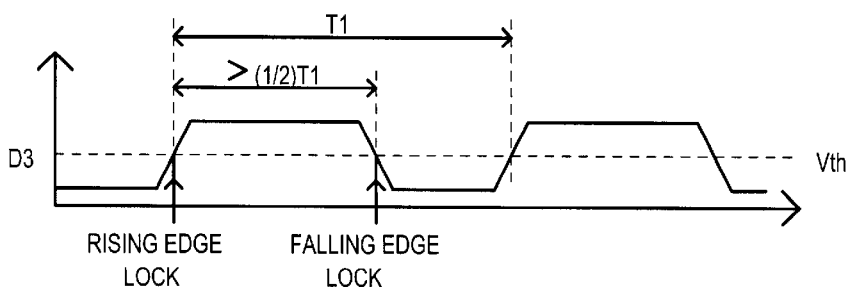
FIG. 12 is a timing diagram illustrating internal clock signal D3 according to one embodiment.

Referring now to FIG. 12, a timing diagram illustrating internal clock signal D3 according to one embodiment is set forth. The timing diagram of FIG. 12 may illustrate a case in which the high-going pulse width of external clock signal D1 is greater than one-half T1, where T1 is the period of external clock signal D1. The rising and falling edges of internal clock signal D3 may be locked on the rising and falling edges of external clock D1. In this way, a single internal clock signal may be generated that locks onto both edges of an external clock signal.

As noted referring to FIGS. 11 and 12, a single internal clock signal may have edges that lock onto both the rising and falling edges of an external clock signal regardless as to the pulse-widths of the external clock signal.

Referring once again to FIG. 4 in conjunction with FIGS. 11 and 12, the rising edge of internal clock signal D3 may be determined by a control loop that may include first phase decision circuit 1 and arbitrary phase generator circuit 3. When the logic level of external clock signal D1 is logic high at the time internal clock signal D3 transitions to a logic high level, first phase decision circuit 1 may generate a logic high phase decision result signal D4. However, when the logic level of external clock signal D1 is logic low at the time internal clock signal D3 transitions to a logic high level, first phase decision circuit 1 may generate a logic low phase decision result signal D4. In this way, first phase decision circuit 1 may indicate whether the rising edge of internal clock signal D3 needs to be delayed in time or sped-up in time.

The falling edge of internal clock signal D3 may be determined by a control loop that may include second phase decision circuit 2 and arbitrary phase generator circuit 3. When the logic level of external clock signal D1 is logic high at the time internal clock signal D3 transitions to a logic low level, second phase decision circuit 2 may generate a logic high phase decision result signal D5. However, when the logic level of external clock signal D1 is logic low at the time internal clock signal D3 transitions to a logic low level, second phase decision circuit 2 may generate a logic low phase decision result signal D5. In this way, second phase decision circuit 2 may indicate whether the falling edge of internal clock signal D3 needs to be delayed in time or sped-up in time.

Arbitrary phase generator circuit 3 may receive reference clock signal D2 and may provide a delay determined by phase decision result signal D4 to generate adjusted reference clock signal D2'. Adjusted reference clock signal D2' may include complementary signals (T and B). When phase decision result signal D4 has a logic high, arbitrary phase generator circuit 3 may generate adjusted reference clock signal D2' having a smaller time delay (than the previous cycle) from reference clock signal D2. When phase decision result signal D4 has a logic low, arbitrary phase generator circuit 3 may generate adjusted reference clock signal D2' having a larger time delay (than the previous cycle) from reference clock signal D2.

Variable pulse width circuit 4 may receive adjusted reference clock signal D2' and may provide internal clock signal D3 by adjusting the pulse width of adjusted reference clock signal D2' according to the logic value of phase decision result signal D5. When phase decision result signal D5 has a logic high, variable pulse width circuit 4 may generate internal clock signal D3 having a larger pulse width than the previous cycle. The pulse width may be the logic high pulse width, as just one example. When phase decision result signal D5 has a logic low, variable pulse width circuit 4 may generate internal clock signal D3 having a smaller pulse width than the previous cycle.

Figure 5:
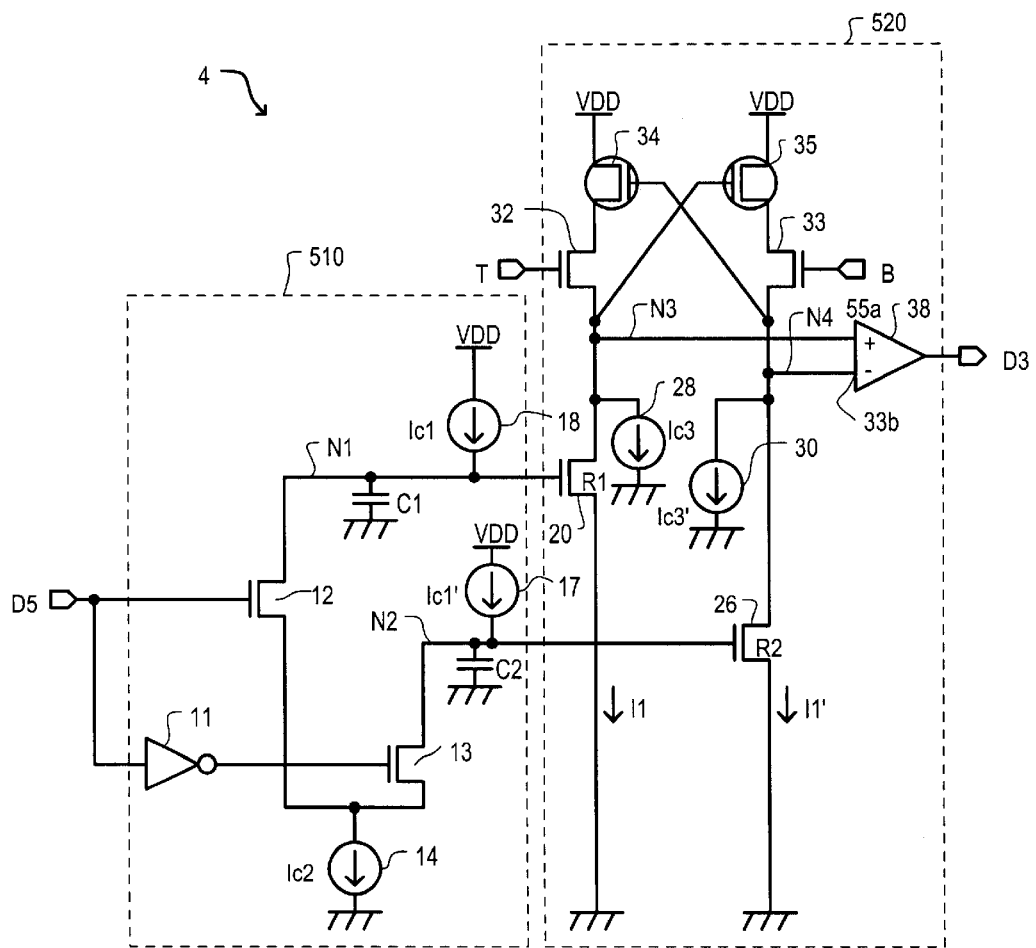
FIG. 5 is a circuit schematic diagram of a variable pulse width circuit according to one embodiment.

Referring now to FIG. 5, a circuit schematic diagram of variable pulse width circuit 4 according to one embodiment is set forth. Variable pulse width circuit 4 of FIG. 5 may be used as variable pulse width circuit 4 in DLL circuit 10 of FIG. 4.

Variable pulse width circuit 4 may receive phase decision result signal D5 and complementary signals (T and B) as inputs and may generate internal clock signal D3. Complementary signals may be adjusted reference clock signal D2' (FIG. 4).

Variable pulse width circuit may include an impedance (or delay) control circuit 510 and a delay circuit 520.

Impedance control circuit 510 may receive phase decision result signal D5 as an input and may provide outputs to delay circuit 520 at impedance control nodes (N1 and N2). Delay circuit may receive inputs at impedance control nodes (N1 and N2), complementary signals (T and B), and may generate internal clock signal D3.

Impedance control circuit 510 may include inverter 11, transistors (12 and 13), current sources (14, 17, and 18) and capacitors (C1 and C2).

Phase decision result signal D5 may be applied as an input to inverter 11 and a control gate of transistor 12. Inverter 11 may provide an output to a control gate of transistor 13. Current source 14 may have one terminal connected to ground potential and another terminal may be connected to sources of transistors (12 and 13). Current source 14 may provide a constant current Ic2 when a potential is applied across its terminals. Transistor 12 may have a drain connected to an impedance control node N1. Transistor 13 may have a drain connected to an impedance control node N2. Transistors (12 and 13) may be n-type insulated gate field effect transistors (IGFETs).

Capacitor C1 may have one terminal connected to ground potential and another terminal connected to impedance control node N1. Current source 18 may have one terminal connected to power supply potential VDD and another terminal connected to impedance control node N1. Current source 18 may provide a constant current Ic1 when a potential is applied across its terminals.

Capacitor C2 may have one terminal connected to ground potential and another terminal connected to impedance control node N2. Current source 17 may have one terminal connected to power supply potential VDD and another terminal connected to impedance control node N2. Current source 17 may provide a constant current Ic1' when a potential is applied across its terminals.

Constant current Ic1 may be approximately equal to constant current Ic1'. Constant current Ic2 may be greater than constant currents (Ic1 and Ic1').

Delay circuit 520 may include controllable impedance devices (20 and 26), current sources (28 and 30), transistors (32 to 35), and a buffer 38.

Controllable impedance device 20 may be an n-type insulated gate field effect transistor (IGFET) having a source connected to ground potential, a drain connected to delay node N3 and a control gate connected to impedance control node N1. Current source 28 may have one terminal connected to ground potential and another terminal connected to delay node N3.

Controllable impedance device 26 may be an n-type IGFET having a source connected to ground potential, a drain connected to delay node N4 and a control gate connected to impedance control node N2. Current source 30 may have one terminal connected to ground potential and another terminal connected to delay node N4.

Transistor 32 may have a gate connected to receive complementary signal T, a source connected to delay node N3 and a drain connected to a drain of transistor 34. Transistor 34 may have a source connected to power supply potential VDD and a gate connected to delay node N4.

Transistor 33 may have a gate connected to receive complementary signal B, a source connected to delay node N4 and a drain connected to a drain of transistor 35. Transistor 35 may have a source connected to power supply potential VDD and a gate connected to delay node N3.

Buffer 38 may have one input terminal 38a connected to delay node N3 and another input terminal 38b connected to delay node N4. Buffer 38 may provide internal clock signal D3 as an output.

The operation of variable pulse width circuit 4 will now be described.

When the falling (negative) edge of internal clock signal D3 is too early, variable pulse width circuit 4 may delay the generation of the next falling edge of internal clock signal D3.

As noted earlier, when internal clock signal D3 transitions to a logic low level when external clock signal D1 is still high, phase decision result signal D5 may become logic high. This logic high may be applied to impedance control circuit 510. Transistor 12 may be turned on and transistor 13 may be turned off. As noted earlier, constant current Ic1 may be less than constant current Ic2. Thus, capacitor C1 may be discharged through transistor 12 and current source 14 and the potential at impedance control node N1 may be lowered. However, capacitor C2 may be charged through current source 17 and the potential at impedance control node N2 may be raised.

The potential at impedance control nodes (N1 and N2) may be applied to delay circuit 520. With the potential at impedance control node N1 lowered, controllable impedance device 20 may have an increased impedance. This can decrease the value of current I1 flowing through controllable impedance device 20 to ground. With the potential at impedance control node N2 raised, controllable impedance device 26 may have a decreased impedance. This can increase the value of current I1' flowing through controllable impedance device 26 to ground.

The falling edge of internal clock signal D3 may be generated off falling edge of complementary signal T and the rising edge of complementary signal B. When a logic high level of complementary signal B is applied to delay circuit 520 at the gate of transistor 33, transistor 33 may turn on. However, the potential at delay node N4 may rise more slowly than in the previous clock cycle due to the increase in current I1'. At approximately the same time, a logic low level complementary signal T may be applied to delay circuit 520 at the gate of transistor 32, which may turn off transistor 32. Because current I1 is decreased, delay node N3 may fall more slowly than in the previous clock cycle. By delaying the rise time of delay node N4 and the fall time of delay node N3, the falling edge of internal clock signal D3 may be delayed. In this way, variable pulse width circuit 4 may compensate for the falling edge of internal clock signal D3 being too early.

When the falling (negative) edge of internal clock signal D3 is too late, variable pulse width circuit 4 may speed-up the generation of the next falling edge of internal clock signal D3.

As noted earlier, when internal clock signal D3 transitions to a logic low level when external clock signal D1 is still already low, phase decision result signal D5 may become logic low. This logic low may be applied to impedance control circuit 510. Transistor 13 may be turned on and transistor 12 may be turned off. As noted earlier, constant current Ic1' may be less than constant current Ic2. Thus, capacitor C2 may be discharged through transistor 13 and current source 14 and the potential at impedance control node N2 may be lowered. However, capacitor C1 may be charged through current source 18 and the potential at impedance control node N1 may be raised.

The potential at impedance control nodes (N1 and N2) may be applied to delay circuit 520. With the potential at impedance control node N2 lowered, controllable impedance device 26 may have an increased impedance. This can decrease the value of current I1' flowing through controllable impedance device 26 to ground. With the potential at impedance control node N1 raised, controllable impedance device 20 may have a decreased impedance. This can increase the value of current I1 flowing through controllable impedance device 20 to ground.

The falling edge of internal clock signal D3 may be generated off falling edge of complementary signal T and the rising edge of complementary signal B. When a logic high level of complementary signal B is applied to delay circuit 520 at the gate of transistor 33, transistor 33 may turn on. However, the potential at delay node N4 may rise more quickly than in the previous clock cycle due to the decrease in current I1'. At approximately the same time, a logic low level complementary signal T may be applied to delay circuit 520 at the gate of transistor 32, which may turn off transistor 32. Because current I1 is increased, delay node N3 may fall more quickly than in the previous clock cycle. By speeding up the rise time of delay node N4 and the fall time of delay node N3, the falling edge of internal clock signal D3 may be sped-up. In this way, variable pulse width circuit 4 may compensate for the falling edge of internal clock signal D3 being too late.

Figure 6:
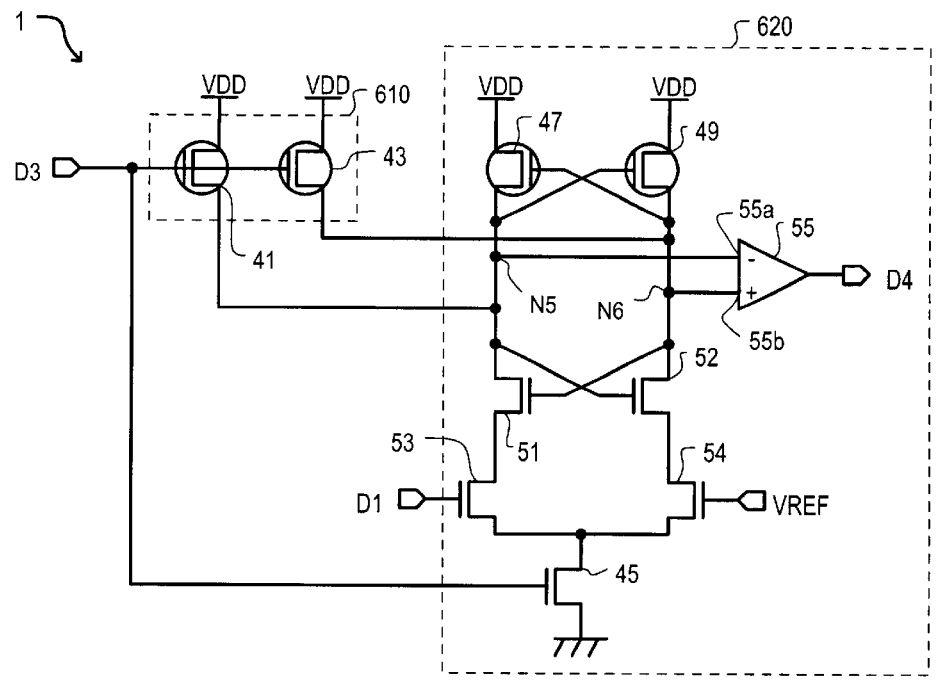
FIG. 6 is a circuit schematic diagram of a first phase decision circuit according to one embodiment.

Referring now to FIG. 6, a circuit schematic diagram of first phase decision circuit 1 according to one embodiment is set forth. First phase decision circuit 1 of FIG. 6 may be used as first phase decision circuit 1 in DLL circuit 10 of FIG. 4.

First phase decision circuit 1 can include a precharge circuit 610 and a latch circuit 620.

First phase decision circuit 1 may receive internal clock signal D3 and external clock signal D1 as inputs and may generate phase decision result signal D4.

Precharge circuit 610 may include transistors (41 and 43). Transistor 41 may have a source connected to power supply VDD, a drain connected to a latch node N5, and a gate connected to receive internal clock signal D3. Transistor 43 may have a source connected to power supply VDD, a drain connected to a latch node N6, and a gate connected to receive internal clock signal D3. Transistors (41 and 43) may be p-type IGFETs.

Latch circuit 620 may include transistors (45, 47, 49, 51 to 54) and a buffer 55. Transistor 45 may have a source connected to ground, a drain commonly connected to sources of transistors (53 and 54), and a gate connected to receive internal clock signal D3. Transistor 53 may have a drain connected to a source of transistor 51 and a gate connected to receive external clock signal D1. Transistor 51 may have a drain connected to latch node N5 and a gate connected to latch node N6. Transistor 54 may have a drain connected to a source of transistor 52 and a gate connected to a reference potential Vref. Transistor 52 may have a drain connected to latch node N6 and a gate connected to latch node N5. Transistor 47 may have a source connected to power supply VDD, a drain connected to latch node N5, and a gate connected to latch node N6. Transistor 49 may have a source connected to power supply VDD, a drain connected to latch node N6, and a gate connected to latch node N5. Transistors (45 and 51 to 54) may be n-type IGFETs. Transistors (47 and 49) may be p-type IGFETs.

Buffer 55 may have an input terminal 55a connected to latch node N5 and an input terminal 55b connected to latch node N6. Buffer 55 may generate phase decision result signal D4 at an output.

The operation of first phase decision circuit 1 will now be discussed.

When internal clock signal D3 is low, first phase decision circuit 1 may be disabled. Precharge circuit 610 may receive the internal clock signal D3 at the gates of transistors (41 and 43). With a logic low signal applied to their gates, transistors (41 and 43) may be turned on. With transistor 41 turned on, latch node N5 may be charged to a potential of the power supply VDD. With transistor 43 turned on, latch node N6 may be charged to a potential of the power supply VDD.

Latch circuit 620 may receive the low internal clock signal D3 at the gate of transistor 45. Thus, transistor 45 may be turned off. This may place latch circuit 620 in a disable state.

When internal clock signal D3 transitions from low to high, first phase decision circuit 1 may output a phase decision result signal D4 having a logic value determined by the value of external clock signal D1 at the time of the transition.

When internal clock signal D3 transitions to high, transistors (41 and 43) within precharge circuit 610 may be turned off.

Transistor 45, within latch circuit 620, may receive the logic high internal clock signal D3 at its gate. Thus, transistor 45 may be turned on. This may place latch circuit 620 in an enable state. In this way, latch circuit 620 may operate as a differential amplifier having a latched output.

The gates of transistors (53 and 54) may operate as differential inputs receiving internal clock signal D1 and a reference potential VREF, respectively. If the potential of external clock signal D1 is greater than reference potential VREF, transistor 53 may be turned on harder than transistor 54. This may allow latch node N5 to be pulled low faster than latch node N6. Because of the cross-coupled arrangement of transistors (47, 49, 51, and 52), transistor 49 may turn on harder than transistor 47 and transistor 51 may turn on harder than transistor 52. In this way, latch node N6 may become high and latch node N5 may become low. With latch node N5 low and latch node N6 high, buffer 55 may generate a logic high output as phase decision result signal D4.

Transistors (47, 49, 51, and 52) may serve to latch these logic levels at latch nodes (N5 and N6) until internal clock signal D3 returns low.

However, if the potential of external clock signal D1 is less than reference potential VREF, transistor 54 may be turned on harder than transistor 53. This may allow latch node N6 to be pulled low faster than latch node N5. Because of the cross-coupled arrangement of transistors (47, 49, 51, and 52), transistor 47 may turn on harder than transistor 49 and transistor 52 may turn on harder than transistor 51. In this way, latch node N5 may become high and latch node N6 may become low. With latch node N6 low and latch node N5 high, buffer 55 may generate a logic low output as phase decision result signal D4.

Transistors (47, 49, 51, and 52) may serve to latch these logic levels at latch nodes (N5 and N6) until internal clock signal D3 returns low.

In this way, first phase decision circuit 1 may sample the logic level of external clock signal D1 at the time internal clock signal D3 transitions from low to high (positive edge). If external clock signal D1 is low at this time, phase decision result signal D4 may become low. If external clock signal D1 is high at this time, phase decision result signal D4 may become high. In this way, first phase decision circuit 1 may determine whether internal clock signal D3 has a positive edge that needs to be sped-up or delayed in time.

Figure 7:
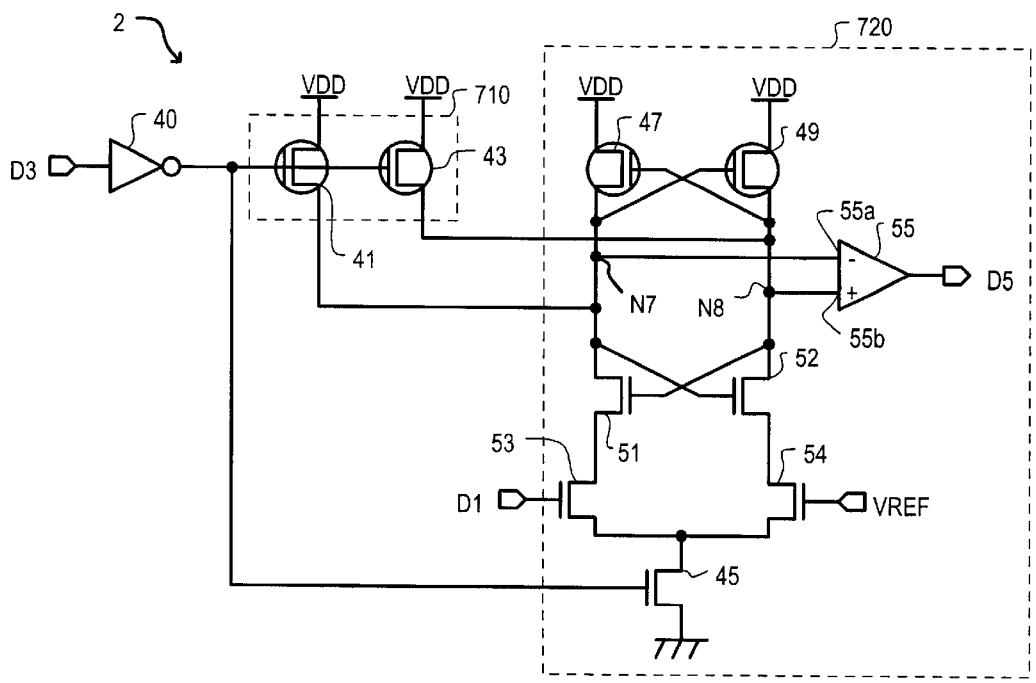
FIG. 7 is a circuit schematic diagram of a second phase decision circuit according to one embodiment.

Referring now to FIG. 7, a circuit schematic diagram of second phase decision circuit 2 according to one embodiment is set forth. First phase decision circuit 2 of FIG. 7 may be used as second phase decision circuit 2 in DLL circuit 10 of FIG. 4.

Second phase decision circuit 2 may include similar circuit elements as first phase decision circuit 1. Such similar circuit elements may have the same general reference character.

Second phase decision circuit 2 can include a precharge circuit 710, a latch circuit 720, and an inverter 40.

Second phase decision circuit 2 may receive internal clock signal D3 and external clock signal D1 as inputs and may generate phase decision result signal D5.

Inverter 40 may receive internal clock signal D3 as an input and may provide an output that may be received by precharge circuit 710 and latch circuit 720.

Precharge circuit 710 may include transistors (41 and 43). Transistor 41 may have a source connected to power supply VDD, a drain connected to a latch node N7, and a gate connected to receive internal clock signal D3 through inverter 40. Transistor 43 may have a source connected to power supply VDD, a drain connected to a latch node N8, and a gate connected to receive internal clock signal D3 through inverter 40. Transistors (41 and 43) may be p-type IGFETs.

Latch circuit 720 may include transistors (45, 47, 49, 51 to 54) and a buffer 55. Transistor 45 may have a source connected to ground, a drain commonly connected to sources of transistors (53 and 54), and a gate connected to receive internal clock signal D3 through inverter 40. Transistor 53 may have a drain connected to a source of transistor 51 and a gate connected to receive external clock signal D1. Transistor 51 may have a drain connected to latch node N7 and a gate connected to latch node N8. Transistor 54 may have a drain connected to a source of transistor 52 and a gate connected to a reference potential Vref. Transistor 52 may have a drain connected to latch node N8 and a gate connected to latch node N7. Transistor 47 may have a source connected to power supply VDD, a drain connected to latch node N7, and a gate connected to latch node N8. Transistor 49 may have a source connected to power supply VDD, a drain connected to latch node N8, and a gate connected to latch node N7. Transistors (45 and 51 to 54) may be n-type IGFETs. Transistors (47 and 49) may be p-type IGFETs.

Buffer 55 may have an input terminal 55a connected to latch node N7 and an input terminal 55b connected to latch node N8. Buffer 55 may generate phase decision result signal D5 at an output.

The operation of second phase decision circuit 2 will now be discussed.

When internal clock signal D3 is high, second phase decision circuit 2 may be disabled. Precharge circuit 710 may receive the internal clock signal D3 (through inverter 40) at the gates of transistors (41 and 43). With a logic low signal applied to their gates, transistors (41 and 43) may be turned on. With transistor 41 turned on, latch node N7 may be charged to a potential of the power supply VDD. With transistor 43 turned on, latch node N8 may be charged to a potential of the power supply VDD.

Latch circuit 720 may receive the high internal clock signal D3 (through inverter 40) at the gate of transistor 45. Thus, transistor 45 may be turned off. This may place latch circuit 720 in a disable state.

When internal clock signal D3 transitions from high to low, second phase decision circuit 2 may output a phase decision result signal D5 having a logic value determined by the value of external clock signal D1 at the time of the transition.

When internal clock signal D3 transitions to low, transistors (41 and 43) within precharge circuit 710 may be turned off.

Transistor 45, within latch circuit 720, may receive a logic high signal at its gate. Thus, transistor 45 may be turned on. This may place latch circuit 720 in an enable state. In this way, latch circuit 720 may operate as a differential amplifier having a latched output.

The gates of transistors (53 and 54) may operate as differential inputs receiving internal clock signal D1 and a reference potential VREF, respectively. If the potential of external clock signal D1 is greater than reference potential VREF, transistor 53 may be turned on harder than transistor 54. This may allow latch node N7 to be pulled low faster than latch node N8. Because of the cross-coupled arrangement of transistors (47, 49, 51, and 52), Transistor 49 may turn on harder than transistor 47 and transistor 51 may turn on harder than transistor 52. In this way, latch node N8 may become high and latch node N7 may become low. With latch node N7 low and latch node N8 high, buffer 55 may generate a logic high output as phase decision result signal D5.

Transistors (47, 49, 51, and 52) may serve to latch these logic levels at latch nodes (N5 and N6) until internal clock signal D3 returns high.

However, if the potential of external clock signal D1 is less than reference potential VREF, transistor 54 may be turned on harder than transistor 53. This may allow latch node N8 to be pulled low faster than latch node N7. Because of the cross-coupled arrangement of transistors (47, 49, 51, and 52), Transistor 47 may turn on harder than transistor 49 and transistor 52 may turn on harder than transistor 51. In this way, latch node N7 may become high and latch node N8 may become low. With latch node N8 low and latch node N7 high, buffer 55 may generate a logic low output as phase decision result signal D5.

Transistors (47, 49, 51, and 52) may serve to latch these logic levels at latch nodes (N5 and N6) until internal clock signal D3 returns high.

In this way, second phase decision circuit 2 may sample the logic level of external clock signal D1 at the time internal clock signal D3 transitions from high to low (negative edge).

If external clock signal D1 is low at this time, phase decision result signal D5 may become low. If external clock signal D1 is high at this time, phase decision result signal D5 may become high. In this way, second phase decision circuit 2 may determine whether internal clock signal D3 has a negative edge that needs to be sped-up or delayed in time.

Figure 8:
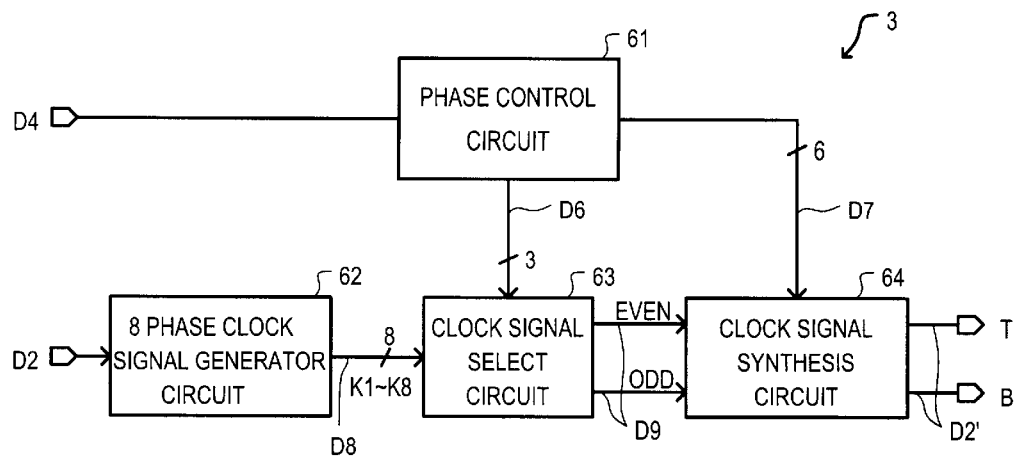
FIG. 8 is a block schematic diagram of an arbitrary phase generator according to one embodiment.

Referring now to FIG. 8, a block schematic diagram of arbitrary phase generator 3 according to one embodiment is set forth. Arbitrary phase generator 3 of FIG. 8 can be used as arbitrary phase generator 3 in DLL circuit 10 of FIG. 4.

Arbitrary phase generator 3 may receive phase decision result signal D4 and reference clock signal D2 as inputs and may generate adjusted reference clock signal D2'. Adjusted reference clock signal D2' may include complementary signals (T and B).

Arbitrary phase generator 3 may include a phase control circuit 61, an 8-phase clock signal generator circuit 62, a clock signal select circuit 63, and a clock signal synthesis circuit 64.

8-phase clock signal generator may receive reference clock signal D2 and may generate eight phase clock signal D8 as an output. Eight phase clock signal D8 may include eight separate clock signals (K1 to K8).

Phase control circuit 61 may receive phase decision result signal D4 and may generate clock signal select signal D6 and synthesis ratio signal D7. Clock signal select D6 may be a 3-bit signal, as just one example. Synthesis ratio signal D7 may be a 6-bit signal, as just one example.

Clock signal select circuit 63 may receive clock signal select signal D6 and eight phase clock signal D8 and may generate 2-phase signal D9. 2-phase signal D9 may include EVEN signal and ODD signal, which may have a phase difference of ⅛ clock cycle with respect to one another.

Clock signal synthesis circuit 64 may receive 2-phase signal D9 and synthesis ratio signal D7 and may generate adjusted reference clock signal D2'. Adjusted reference clock signal D2' may include complementary signals (T and B).

The operation of arbitrary phase generator circuit 3 will now be described.

8-phase clock signal generator may receive reference clock signal D2 and may generate eight phase clock signal D8 as an output. Eight phase clock signal D8 may include eight separate clock signals (K1 to K8).

Figure 9:
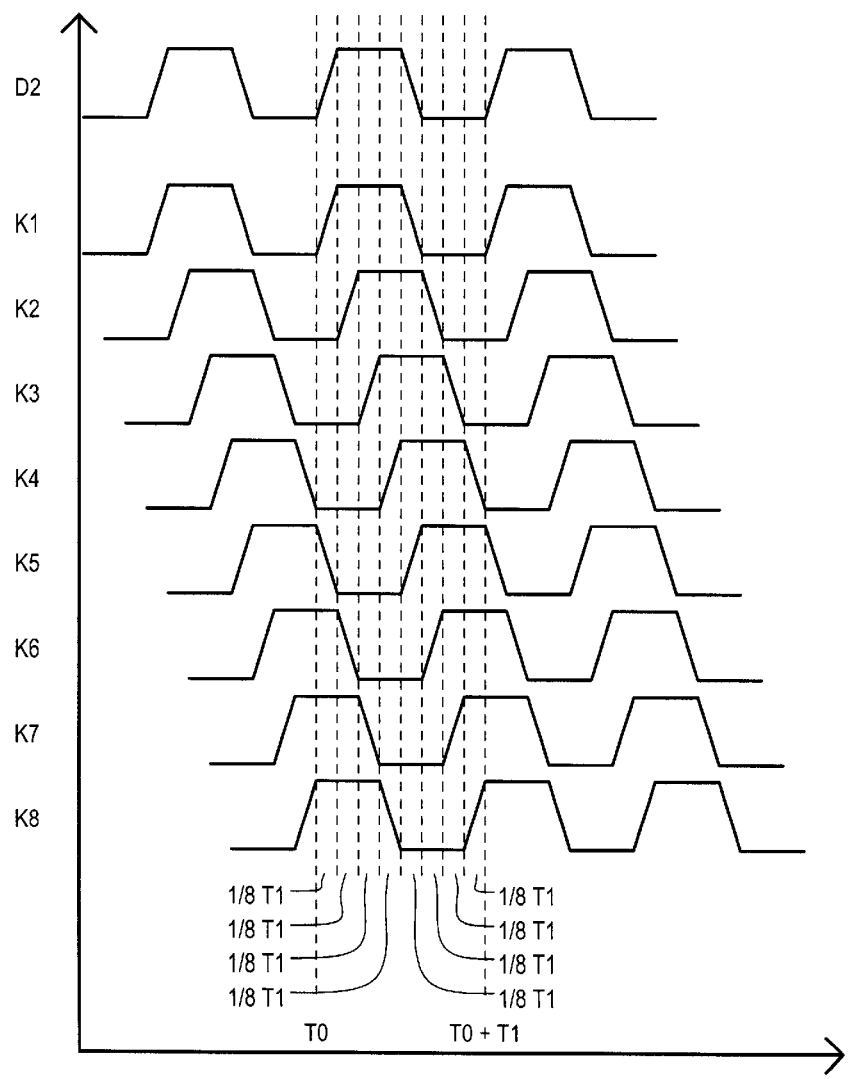
FIG. 9 is a timing diagram illustrating the reference clock signal and eight phase clock signals according to one embodiment.

Referring now to FIG. 9, a timing diagram illustrating the reference clock signal D2 and eight phase clock signals (K1 to K8) according to one embodiment.

Clock signal K1 may be in phase with reference clock signal D2. Clock signal K2 may be shifted by ⅛ clock cycle T1 with respect to reference clock cycle D2. Clock signal K3 may be shifted by ¼ clock cycle T1 with respect to reference clock cycle D2. Clock signal K4 may be shifted by ⅜ clock cycle T1 with respect to reference clock cycle D2. Clock signal K5 may be shifted by ½ clock cycle T1 with respect to reference clock cycle D2. Clock signal K6 may be shifted by ⅝ clock cycle T1 with respect to reference clock cycle D2. Clock signal K7 may be shifted by ¾ clock cycle T1 with respect to reference clock cycle D2. Clock signal K8 may be shifted by ⅞ clock cycle T1 with respect to reference clock cycle D2.

Phase control circuit 61 may receive phase result signal D4. Based on the value of phase result signal D4, as well as previous clock select signal D6, control circuit 61 may generate a clock signal select signal D6. Clock signal select D6 may be a 3-bit signal, as just one example.

Clock signal select circuit 63 may receive clock signal select signal D6. Based on the value of clock signal select signal D6, clock signal select circuit 63 may select a clock signal (K1 to K8). Based on the clock signal (K1 to K8) selected, signals having selected phase shifts with respect to reference clock signal D2 may be generated as 2-phase signal D9. 2-phase signal D9 may include an EVEN signal and an ODD signal, which may have a ⅛ phase shift with respect to one another.

Phase control circuit 61 may also generate a synthesis ratio signal D7, based on the value of phase result signal D4, as well as previous synthesis ratio signal D7. Synthesis ratio signal D7 may be a 6-bit signal, as just one example.

Clock signal synthesis circuit 64 may receive synthesis ratio signal D7. Clock signal synthesis circuit 64 may synthesize 2-phase signal D9 according to a synthesis ratio that may be indicated by synthesis ratio signal D7. Clock signal synthesis circuit 64 may generate a synthesized signal as adjusted reference clock signal D2'. Adjusted reference clock signal may include complementary signals (T and B).

Figure 10:
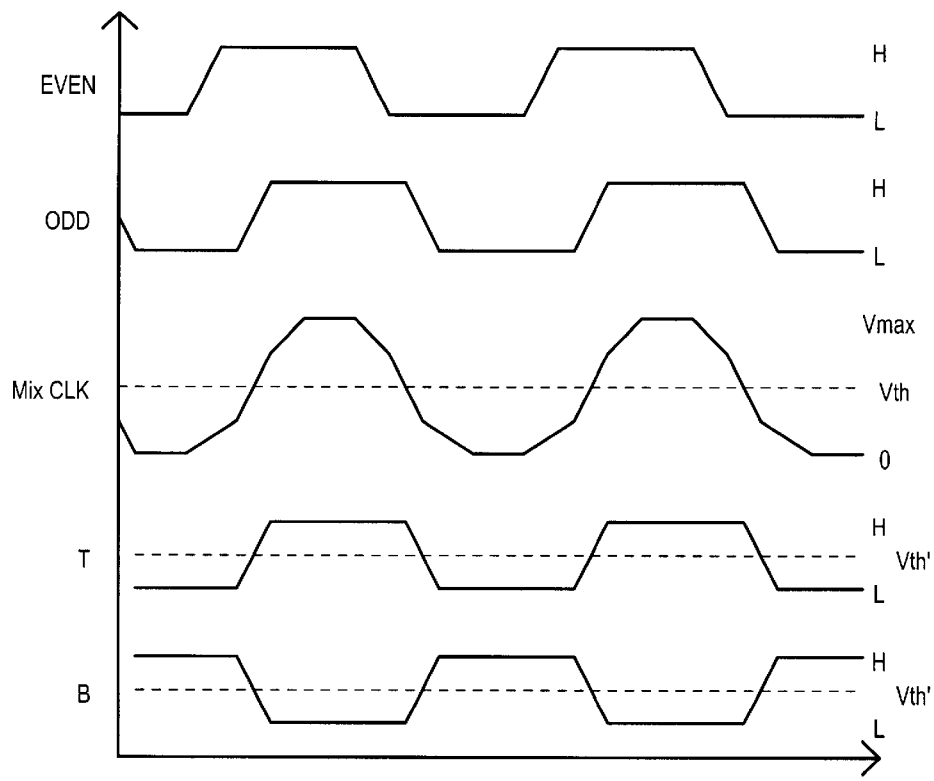
FIG. 10 is a timing diagram illustrating signals in an arbitrary phase generator circuit according to one embodiment.

Referring now to FIG. 10, a timing diagram illustrating signals in arbitrary phase generator circuit 3 according to one embodiment is set forth.

The timing diagram of FIG. 10 can include clock signal EVEN, clock signal ODD, a clock signal Mix CLK, complementary signal T, and complementary signal B. Clock signal EVEN and clock signal ODD may be included in 2-phase signal D9 of arbitrary phase generator circuit 3 of FIG. 8. Complementary signals (T and B) may be included in adjusted reference clock signal D2' of arbitrary phase generator circuit 3 of FIG. 8.

Referring still to FIG. 10, it is assumed that clock signal EVEN has a phase that is ⅛ period T1 earlier than the phase of clock signal ODD.

Clock signal synthesis circuit 64 may synthesize clock signal EVEN and clock signal ODD according to a synthesis ratio that may be selected by synthesis ratio signal D7. In this way clock signal Mix CLK may be generated. Clock signal synthesis circuit 64 may compare the potential level of clock signal Mix CLK and a predetermined threshold voltage Vth. Threshold voltage Vth may be set to approximately ½ of a maximum voltage level Vmax of clock signal Mix CLK. When the potential level of clock signal Mix CLK is higher than threshold voltage Vth, complementary signal T may become high and complementary signal B may become low. When the potential level of clock signal Mix CLK is lower than threshold voltage Vth, complementary signal T may become low and complementary signal B may become high.

Complementary signals (T and B) may have waveform deformation. To minimize this, complementary signal T and complementary signal B may transition from a high to a low and vice-versa in a complementary fashion at approximately the same time when the potential level of clock signal Mix CLK crosses threshold voltage Vth. In this way, complementary signals (T and B) may cross a threshold voltage Vth' at approximately the same time clock signal Mix CLK crosses threshold voltage Vth. Threshold voltage Vth' may be approximately ½ of a maximum potential level of complementary signals (T and B).

The operation of DLL circuit 10 will now be described.

Referring once again to FIG. 4, the rising edge of internal clock signal D3 may be determined by a control loop that may include first phase decision circuit 1 and arbitrary phase generator circuit 3. When the logic level of external clock signal D1 is logic high at the time internal clock signal D3 transitions to a logic high level, first phase decision circuit 1 may generate a logic high phase decision result signal D4. However, when the logic level of external clock signal D1 is logic low at the time internal clock signal D3 transitions to a logic high level, first phase decision circuit 1 may generate a logic low phase decision result signal D4. In this way, first phase decision circuit 1 may indicate whether the rising edge of internal clock signal D3 needs to be delayed in time or sped-up in time.

The falling edge of internal clock signal D3 may be determined by a control loop that may include second phase decision circuit 2 and variable pulse width circuit 4. When the logic level of external clock signal D1 is logic high at the time internal clock signal D3 transitions to a logic low level, second phase decision circuit 2 may generate a logic high phase decision result signal D5. However, when the logic level of external clock signal D1 is logic low at the time internal clock signal D3 transitions to a logic low level, second phase decision circuit 2 may generate a logic high phase decision result signal D5. In this way, second phase decision circuit 2 may indicate whether the falling edge of internal clock signal D3 needs to be delayed in time or sped-up in time.

Arbitrary phase generator circuit 3 may receive reference clock signal D2 and may provide a delay determined by phase decision result signal D4 to generate adjusted reference clock signal D2'. Adjusted reference clock signal D2' may include complementary signals (T and B). When phase decision result signal D4 has a logic high, arbitrary phase generator circuit 3 may generate adjusted reference clock signal D2' having a smaller time delay (than the previous cycle) from reference clock signal D2. When phase decision result signal D4 has a logic low, arbitrary phase generator circuit 3 may generate adjusted reference clock signal D2' having a larger time delay (than the previous cycle) from reference clock signal D2.

In this way, the positive edge of internal clock signal D3 may be locked with the positive edge of external clock signal D1.

Variable pulse width circuit 4 may receive adjusted reference clock signal D2' and may provide internal clock signal D3 by adjusting the pulse width of adjusted reference clock signal D2' according to the logic value of phase decision result signal D5. When phase decision result signal D5 has a logic high, variable pulse width circuit 4 may generate internal clock signal D3 having a larger pulse width than the previous cycle. The pulse width may be the logic high pulse width, as just one example. When phase decision result signal D5 has a logic low, variable pulse width circuit 4 may generate internal clock signal D3 having a smaller pulse width than the previous cycle.

In this way, the negative edge of internal clock signal D3 may be locked with the negative edge of external clock signal D1.

It is noted that delays on the rising edge of internal clock signal D3 that may be caused by variable pulse width circuit 4 may be compensated for by first phase decision circuit 1 and arbitrary phase generator circuit 3. Likewise, delays on the falling edge of internal clock signal D3 that may be caused by arbitrary phase generator circuit 3 may be compensated for by second phase decision circuit 2 and variable pulse width circuit 4.

Referring to FIG. 11, a timing diagram illustrating internal clock signal D3 according to one embodiment is set forth. The timing diagram of FIG. 11 may illustrate a case in which the high-going pulse width of external clock signal D1 is less than one-half T1, where T1 is the period of external clock signal D1. The rising and falling edges of internal clock signal D3 may be locked on the rising and falling edges of external clock D1. In this way, a single internal clock signal may be generated that locks onto both edges of an external clock signal.

Referring to FIG. 12, a timing diagram illustrating internal clock signal D3 according to one embodiment is set forth. The timing diagram of FIG. 12 may illustrate a case in which the high-going pulse width of external clock signal D1 is greater than one-half T1, where T1 is the period of external clock signal D1. The rising and falling edges of internal clock signal D3 may be locked on the rising and falling edges of external clock D1. In this way, a single internal clock signal may be generated that locks onto both edges of an external clock signal.

As noted referring to FIGS. 11 and 12, a single internal clock signal may have edges that lock onto both the rising and falling edges of an external clock signal regardless of the pulse-widths of the external clock signal.

Figure 13:
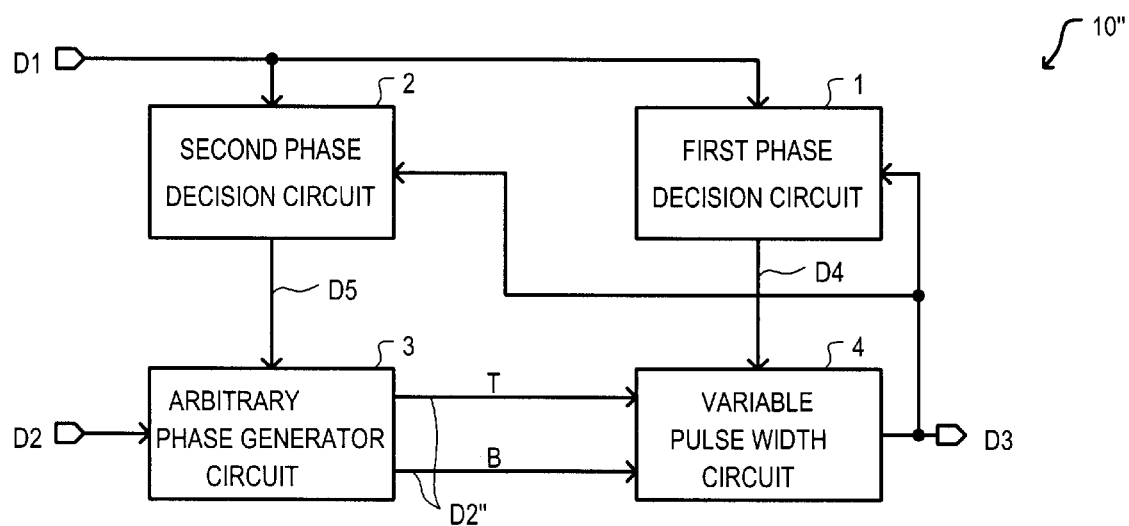
FIG. 13 is block schematic diagram of a delay locked loop (DLL) circuit according to one embodiment.

Referring now to FIG. 13, a block schematic diagram of a DLL circuit according to an embodiment is set forth and given the general reference character 10".

DLL circuit 10" may include a first phase circuit 1, a second phase circuit 2, an arbitrary phase generator 3, and a variable pulse width circuit 4.

DLL circuit 10" may differ from DLL circuit 10 illustrated in the embodiment of FIG. 4, in that variable pulse width circuit 4 may receive phase decision result signal D4 from first phase decision circuit 1. Also, arbitrary phase generator circuit 3 may receive phase decision result signal D5 from second phase decision circuit 2.

The operation and construction of first phase decision circuit 1 in the embodiment of FIG. 13 may be generally the same as first phase decision circuit 1 in the embodiment of FIG. 4. The operation and construction of second phase decision circuit 2 in the embodiment of FIG. 13 may be generally the same as second phase decision circuit 2 in the embodiment of FIG. 4. The operation and construction of arbitrary phase generator circuit 3 in the embodiment of FIG. 13 may be generally the same as arbitrary phase generator circuit 3 in the embodiment of FIG. 4. The operation and construction of variable pulse width circuit 4 in the embodiment of FIG. 13 may be generally the same as variable pulse width circuit 4 in the embodiment of FIG. 4.

In this case, the falling edge of internal clock signal D3 may be determined by a control loop that may include second phase decision circuit 2 and arbitrary phase generator circuit 3. When the logic level of external clock signal D1 is logic high at the time internal clock signal D3 transitions to a logic low level, second phase decision circuit 2 may generate a logic high phase decision result signal D5. However, when the logic level of external clock signal D1 is logic low at the time internal clock signal D3 transitions to a logic low level, second phase decision circuit 2 may generate a logic high phase decision result signal D5. In this way, second phase decision circuit 2 may indicate whether the falling edge of internal clock signal D3 needs to be delayed in time or sped-up in time.

The rising edge of internal clock signal D3 may be determined by a control loop that may include first phase decision circuit 1 and variable pulse width circuit 4. When the logic level of external clock signal D1 is logic high at the time internal clock signal D3 transitions to a logic high level, first phase decision circuit 1 may generate a logic high phase decision result signal D4. However, when the logic level of external clock signal D1 is logic high at the time internal clock signal D3 transitions to a logic low level, second phase decision circuit 1 may generate a logic high phase decision result signal D4. In this way, first phase decision circuit 1 may indicate whether the rising edge of internal clock signal D3 needs to be delayed in time or sped-up in time.

Arbitrary phase generator circuit 3 may receive reference clock signal D2 and may provide a delay determined by phase decision result signal D5 to generate adjusted reference clock signal D2". Adjusted reference clock signal D2" may include complementary signals (T and B).

When phase decision result signal D5 has a logic high, arbitrary phase generator circuit 3 may generate adjusted reference clock signal D2" having a larger time delay (than the previous cycle) from reference clock signal D2. When phase decision result signal D5 has a logic low, arbitrary phase generator circuit 3 may generate adjusted reference clock signal D2" having a smaller time delay (than the previous cycle) from reference clock signal D2.

In this way, the negative edge of internal clock signal D3 may be locked with the positive edge of external clock signal D1.

Variable pulse width circuit 4 may receive adjusted reference clock signal D2" and may provide internal clock signal D3 by adjusting the pulse width of adjusted reference clock signal D2" according to the logic value of phase decision result signal D4. When phase decision result signal D4 has a logic high, variable pulse width circuit 4 may generate internal clock signal D3 having a smaller pulse width than the previous cycle. The pulse width may be the logic low pulse width, as just one example. When phase decision result signal D4 has a logic low, variable pulse width circuit 4 may generate internal clock signal D3 having a larger pulse width than the previous cycle.

In this way, the positive edge of internal clock signal D3 may be locked with the negative edge of external clock signal D1.

It is noted that delays on the falling edge of internal clock signal D3 that may be caused by variable pulse width circuit 4 may be compensated for by second phase decision circuit 2 and arbitrary phase generator circuit 3. Likewise, delays on the rising edge of internal clock signal D3 that may be caused by arbitrary phase generator circuit 3 may be compensated for by first phase decision circuit 1 and variable pulse width circuit 4.

The embodiments disclose a DLL circuit that can lock the positive and negative clock edges of an internal clock with the positive and negative edges, respectively of an externally supplied clock. In this way, it may be possible to accurately generate an internal clock signal D3 to operate in synchronism with an external clock signal D1.

Figure 1:
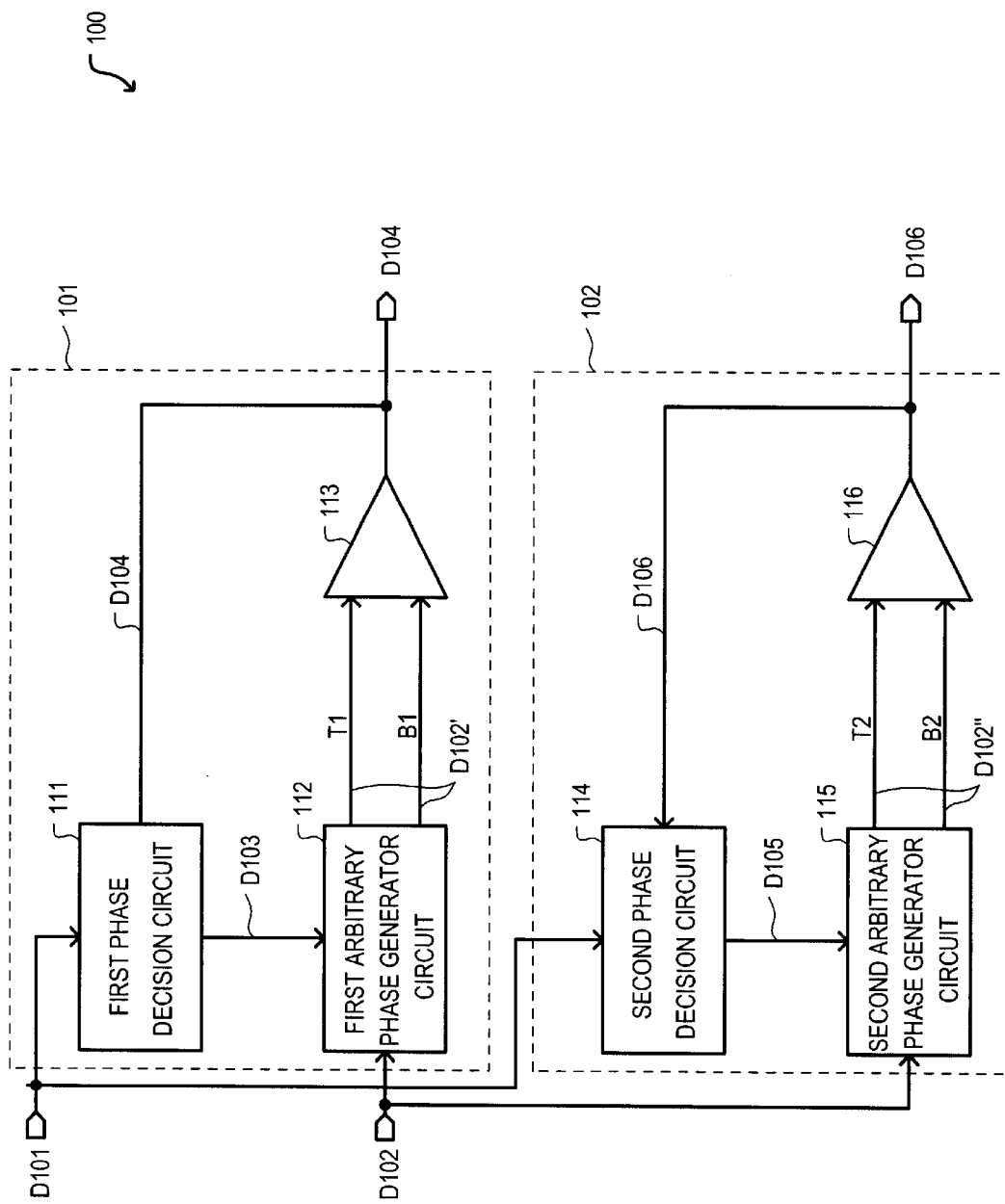
FIG. 1 is a block schematic diagram of a conventional DLL circuit.
Figure 2:
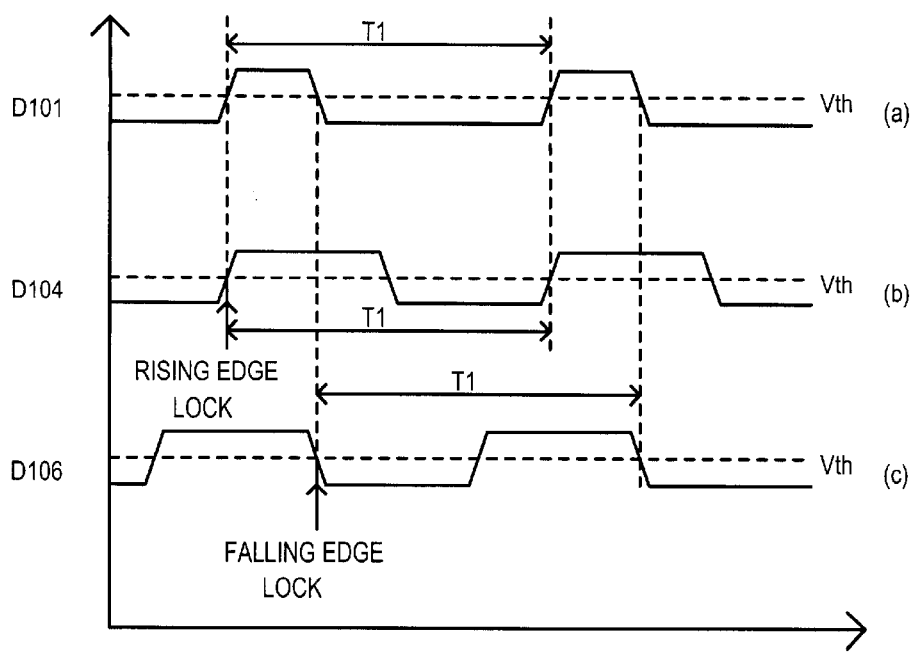
FIGS. 2(a)–(c) is a timing diagram illustrating signals generated by conventional DLL circuit.
Figure 3:
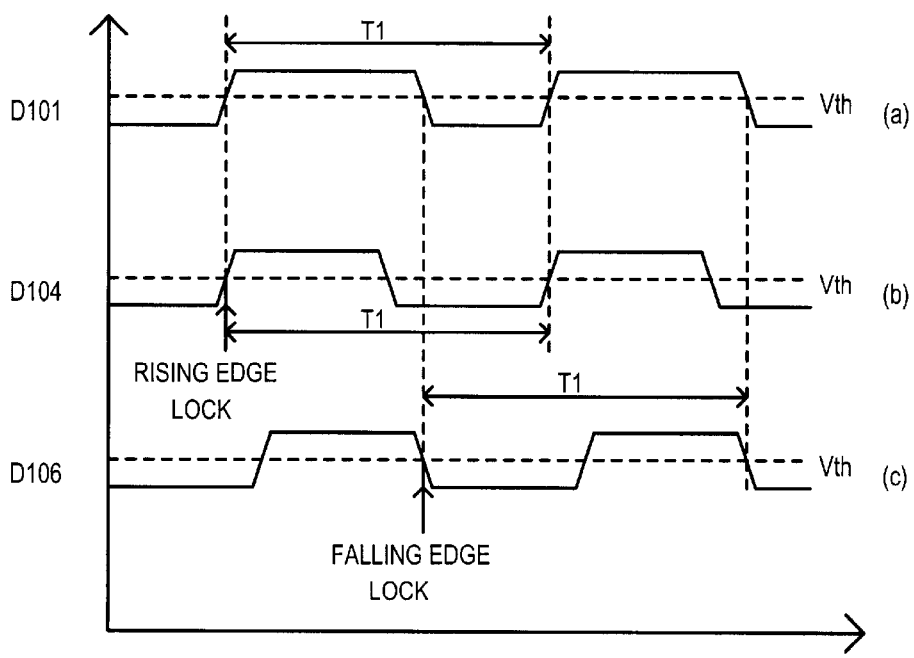
FIGS. 3(a)–(c) is a timing diagram illustrating signals generated by conventional DLL circuit.

It is noted that only one arbitrary phase generator 3 may be used in the embodiments of a DLL circuit (10 and 10") illustrated in FIGS. 4 and 13, respectively. This may reduce overall on chip area consumed by the DLL circuit as opposed to the conventional DLL circuit 100 illustrated in FIG. 1.

It is understood that the embodiments described above are exemplary and the present invention should not be limited to those embodiments. Specific structures should not be limited to the described embodiments.

For example, the logic levels of phase decision result signals may be arbitrary in that a logic high or logic high may indicate that an internal clock edge needs to be sped-up or delayed and vice-versa.

N-type IGFETs and p-type IGFETs may be metal-oxide-semiconductor (MOS) FETs, as just one example.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A delay locked loop (DLL) circuit, comprising:
    an external clock having a first external clock edge and a second external clock edge;
    an internal clock having a first internal clock edge and a second internal clock edge;
    a first phase decision circuit coupled to receive the external clock and the internal clock and providing a first phase decision signal based on a phase relationship between the first external clock edge and the first internal clock edge;
    a second phase decision circuit coupled to receive the external clock and the internal clock and providing a second phase decision signal based on a phase relationship between the second external clock edge and the second internal clock edge;
    an arbitrary phase generator circuit coupled to receive the first phase decision signal and provide an adjusted reference clock having a phase based on the value of the first phase decision signal; and
    a variable pulse width circuit coupled to receive the second phase decision signal and the adjusted reference clock and provide the internal clock having a pulse width based on the value of the second phase decision signal.

2. The DLL circuit according to claim 1, wherein:
    the first internal clock edge is substantially locked with the first external clock edge; and
    the second internal clock edge is substantially locked with the second external clock edge.

3. The DLL circuit according to claim 2, wherein:
    the first internal clock edge is a positive edge;
    the first external clock edge is a positive edge;
    the second internal clock edge is a negative edge; and
    the second external clock edge is a negative edge.

4. The DLL circuit according to claim 2, wherein:
    the first internal clock edge is a negative edge;
    the first external clock edge is a negative edge;
    the second internal clock edge is a positive edge; and
    the second external clock edge is a positive edge.

5. The DLL circuit according to claim 1, wherein:
    the arbitrary phase generator circuit is coupled to receive a reference clock and provide the adjusted reference clock that is phase shifted from the reference clock.

6. The DLL circuit according to claim 5, wherein the arbitrary phase generator circuit includes:
    a phase clock signal generator circuit coupled to receive the reference clock and provide a plurality of phase shifted clock signals;
    a phase control circuit coupled to receive the first phase decision signal and providing at least one clock select signal; and
    a clock signal select circuit coupled to receive the at least one clock select signal and select at least one of the plurality of phase shifted clock signals to generate the adjusted phase clock.

7. A delay locked loop (DLL) control method, comprising the steps of:
    comparing a first phase of an external clock with a first phase of an internal clock and generating a first comparison result;
    generating an adjusted clock from a reference clock based on the first comparison result; and
    adjusting the pulse width of the adjusted clock to generate the internal clock.

8. The DLL control method according to claim 7, wherein:
    adjusting the pulse width of the adjusted clock includes
    comparing a second phase of the external clock with a second phase of the internal clock and generating a second comparison result; and
    adjusting the pulse width of the adjusted clock based on the second comparison result.

9. The DLL control method according to claim 8, wherein:
    comparing the second phase of the external clock with the second phase of the internal clock includes
        enabling a second phase decision circuit based on a second internal clock edge to generate the second comparison result based on the logic level of the external clock.

10. The DLL control method according to claim 7, wherein:
    adjusting the pulse width of the adjusted clock includes
        modifying the propagation delay of a delay circuit by adjusting the impedance of a controllable impedance path.

11. The DLL control method according to claim 7, wherein:
    generating an adjusted clock from a reference clock includes
        generating complementary clock signals phase shifted from the reference clock according to the first comparison result.

* * * * *